United States Patent [19]
Lee

[11] Patent Number: 5,612,251
[45] Date of Patent: Mar. 18, 1997

[54] MANUFACTURING METHOD AND DEVICE FOR A POLYCRYSTALLINE SILICON

[75] Inventor: Jae-won Lee, Seoul, Rep. of Korea

[73] Assignee: Samsung Electronics Co., Ltd., Suwon, Rep. of Korea

[21] Appl. No.: 528,862

[22] Filed: Sep. 15, 1995

Related U.S. Application Data

[63] Continuation of Ser. No. 161,473, Dec. 6, 1993, abandoned.

[30] Foreign Application Priority Data

May 27, 1993 [KR] Rep. of Korea ............... 939357

[51] Int. Cl.⁶ .................................................. H01L 21/20
[52] U.S. Cl. ......................... 437/173; 117/8; 117/53; 117/931
[58] Field of Search ............... 437/173; 117/53, 117/8, 931

[56] References Cited

U.S. PATENT DOCUMENTS

| | | | |
|---|---|---|---|
| 2,354,591 | 7/1944 | Goldsmith. | |
| 4,155,779 | 5/1979 | Auston et al. | 148/1.5 |
| 4,234,356 | 11/1980 | Auston et al. | 219/121 |
| 4,356,384 | 10/1982 | Gat | 219/347 |
| 4,436,557 | 3/1984 | Wood et al. | 148/1.5 |
| 4,851,363 | 7/1989 | Troxell et al. | |
| 4,880,753 | 11/1989 | Meakin et al. | |

FOREIGN PATENT DOCUMENTS

| | | |
|---|---|---|
| 104117 | 5/1987 | Japan. |
| 119576 | 5/1988 | Japan. |
| 25515 | 1/1989 | Japan. |
| 33935 | 2/1990 | Japan. |
| 143559 | 6/1990 | Japan. |
| 2169442 | 7/1986 | United Kingdom. |

OTHER PUBLICATIONS

T. Sameshima et al., "XeCl Excimer Laser Annealing Used in the Fabrication of Poly-Si TFT's," IEEE Electron Device Letters vol. EDL-7, No. 5, May 1986, pp. 276-278.

"Low-Temperature Polycrystalline-Silicon TFT on 7059 Glass" *IEEE Electron Device Letters*, vol. 10, No. 8, Aug. 1989.

T. Hashizume et al., "C-MOS Self-Aligned Low Temperature Poly-Si TFTs Fabricated by Laser Annealing of Poly-Si Films" *22nd Extended Abstract of the Solid State Devices and Materials Conference* (1991), pp. 638-640.

*Primary Examiner*—Robert Kunemund
*Attorney, Agent, or Firm*—Rothwell, Figg, Ernst & Kurz

[57] ABSTRACT

In a manufacturing method and device for a polycrystalline silicon, the manufacturing method forms amorphous silicon on the substrate, and an adiabatic layer between substrate and amorphous silicon if needed. The amorphous silicon is preliminarily heated and melted, and is evenly supplied with heat when the amorphous silicon is re-crystallized, to thereby slow down the re-crystallization. Also, a manufacturing device has first and second light sources for supplying an optical energy to a-Si formed on substrate. A uniformed and large sized grain can be formed, and specifically, cost reduction is possible since the general glass substrate can be used.

17 Claims, 5 Drawing Sheets

AR Coating

MANUFACTURING METHOD AND DEVICE FOR A POLYCRYSTALLINE SILICON

This is a continuation of application Ser. No. 08/161,473, filed Dec. 6, 1993 now abandoned.

BACKGROUND OF THE INVENTION

The present invention relates to a manufacturing method and device for a polycrystalline silicon, and more particularly to a polycrystalline silicon (p-Si) which poly-crystallizes a thin film amorphous silicon (a-Si) using a laser.

Generally, p-Si is in wide use for a direct random access memory (DRAM) semiconductor element or for a liquid crystal display (LCD) wherein a polycrystalline silicon thin film transistor (TFT) is used or for a contact image sensor (CIS). As the conventional method for manufacturing p-Si, the solid phase crystallization (SPC) method performs a heat treatment on a-Si or on a micro-crystalline silicon (μ-Si) at a high temperature, i.e., nearly 1000° C., and the excimer laser annealing (ELA) method scans the surface of a-Si or μ-Si with an excimer laser which then is melted and crystallized.

U.S. Pat. Nos. 4,851,363 and 4,880,753, Japanese Patent Laid-open Publication Nos. sho 62-104117, sho 63-119576, sho 64-025515, hei 02-033935 and hei 02-143559 and GB 2,169,442 disclose the above manufacturing method in various types.

The SPC method enables manufacturing p-Si material whose characteristics are regular. However, a low-cost glass substrate cannot be used for the SPC method since the material, i.e., a-Si, is preformed by heat treatment at a high temperature, which means that the substrate used for the SPC method is greatly restricted.

The low heat treatment method being performed in an approximate 600° C. environment is proposed by relevant publications (Optronics, No.8, 1991, pp 53, and IEEE Electron Device Letters, Vol. 10, No.8, Aug. 1989, pp 349). However, this method also does not permit the use of the low-cost glass substrate.

To improve this problem, the ELA method which performs heat treatment using an excimer laser having a high optical absorption for a-Si is applied. Since the excimer laser used for ELA method forms a short recurring pulse of short wavelength, most of the optical energy is absorbed in the a-Si surface. As a result, a small amount of heat is delivered to the substrate, to thereby enable the advantageous annealing condition which does not give a thermal transformation on the substrate. Additionally, a device whose operation speed is excellent, for example, TFT or TFT LCD, can be manufactured according to the ELA method. However, the pulse-to-pulse energy stability (PPES) of a laser is poor since the duration of the laser pulse used for ELA method is no more than 10–20 ns. It is hard to evenly perform heat treatment throughout the entire surface of substrate due to the characteristic degradation of the scanned region where the beam overlaps. That is, the laser energy absorbed in a-Si is converted into a thermal energy at the moment when an excimer laser beam reaches the a-Si surface, as shown in FIGS. 1 and 2. Accordingly, a-Si is re-crystallized by the thermal energy, and the melting and re-crystallization processes take a very short time, i.e., approximately 100–500 ns. Since the necessary time for the crystallization is very short, the grain size of the polycrystalline silicon which is crystallized according to the ELA method is no more than a matter of hundreds of angstroms. In addition to this, the crystallization state according to the scanned region where the laser beam is irradiated by being overlapped and with respect to the deviation of the laser energy output, becomes serious since the p-Si characteristics change sensitively depending on the change of the energy density.

To solve this problem, a method by which the ELA method is performed while heating the substrate at the same time was proposed in Solid State Devices Materials (1991). This disclosure reveals that the grain size of the crystal increases when the crystallization speed is slowed by performing the ELA operation while heating the substrate, and the scanned region where the laser beam overlaps can be crystallized stably.

However, the substrate cannot be heated sufficiently since the temperature to which the substrate may be heated is limited, and excessive heating time is needed, which results in lowering productivity.

SUMMARY OF THE INVENTION

Accordingly, it is an object of the present invention to provide a manufacturing method and device thereof which can manufacture an even quality polycrystalline silicon even under the low temperature of 600° C.

It is another object of the present invention to provide a manufacturing method and device thereof which can manufacture a polycrystalline silicon wherein low-cost glass instead of costly quartz can be used as a substrate material for a display device.

According to an aspect of the present invention, there is provided a manufacturing method for a polycrystalline silicon in re-crystallizing a-Si thin film formed on the substrate, wherein the manufacturing method comprises the steps of:

preliminarily heating a thin film a-Si prepared on the substrate using a second light source;

heating and melting the preliminarily heated a-Si using a first light source; and re-crystallizing a silicon while heating the melted a-Si using a second light source.

To accomplish the above objects, there is provided another method for manufacturing a polycrystalline silicon comprising the steps of:

forming an adiabatic layer on the substrate;

forming a-Si thin film lying on the insulating layer;

preliminarily heating the a-Si using a second light source;

heating and melting the preliminarily heated a-Si using a first light source; and re-crystallizing a silicon while heating the melted a-Si using a second light source.

Referring to a manufacturing method of the present invention, it is desirable that a second light source irradiates energy onto the substrate from the front or back of the substrate in the step of preliminarily heating a-Si, while a first light source is located in the front of the substrate wherein a thin film a-Si is formed, so as to emit energy. Also, it is desirable to use either $SiO_2$ or $Si_3N_4$ as the material for the adiabatic layer.

An excimer laser can be used as a first light source, and an argon laser, yttrium-aluminum-garnet (YAG) laser, ruby laser, or a helium-neon (He-Ne) laser can be used as a second light source.

The energy from a second light source can be supplied to the melting steps as well as to the first preliminary heating step and to the re-crystallization step, and particularly, can be supplied continuously or in discontinuous pulse.

A manufacturing device of the present invention which manufactures a polycrystalline silicon by re-crystallizing a thin film a-Si formed on the front surface of the substrate comprises:

a first light source located in the front of the substrate and supplies an energy having a higher density than that of the threshold energy of a-Si; and a second light source which is located in the front or back of the substrate which supplies energy having a lower density than that of the threshold energy of a-Si.

Additionally, the second light source of the manufacturing device of the present invention provides continuous or discontinuous energy to a-Si formed on the substrate. Specifically, in order to provide the energy discontinuously, the second light source comprises an optical device, a delivery optics which delivers the light to the thin film a-Si, and a providing controller which blocks off and passes the delivered light so as to supply pulsed energy.

An acousto optic deflector, a polygon mirror wherein a polygonal rotating mirror is used, or a chopper can be used as the providing controller.

A delivery medium for forming a focused beam whose energy density is increased is provided in the delivery optics, and a bundle of fiber which is formed by a number of quartz optic fibers can be used as a delivery medium. Also, an anti reflection coating layer is prepared in the entrance and exit sides of the optical delivery medium in order to prevent an optical loss.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

In a manufacturing method for a polycrystalline silicon of the present invention, a-Si thin film formed on the substrate is heated and melted using a first and second light source, and re-crystallization speed of silicon is controlled by a second silicon light source. Following is a detailed explanation on the above manufacturing method.

The first light source emits an optical energy from the front surface of the substrate wherein a-Si thin film is formed, while the second light source emits an optical energy from the front or back surface of the substrate. The second light source preliminarily heats the thin film before the energy emitted from a first light source is provided to the thin film. The internal energy of the thin film rises to a high level by the preliminary heating, leaving the thin film unmelted. When the internal energy of the thin film rises to some degree, the thin film melts by adding an energy emitted from the first light source to the thin film for a short time. From this time, the energy is continuously supplied from the second light source, and particularly, is supplied for a predetermined time even when the first light source stops providing an optical energy. The energy emitted from the second light source need not to be supplied when an energy is provided from the first light source. However, when the first light source provides an optical energy for a very short time, it is desirable to have the second light source supply energy even when the first light source provides an energy. When the second light source supplies energy, the energy supply has to be controlled to avoid a thermal accumulation on the thin film of the substrate. More desirably, the amount of the thermal energy can be controlled by controlling the second light source to supply thermal energy by a predetermined cycle.

Figure 1:
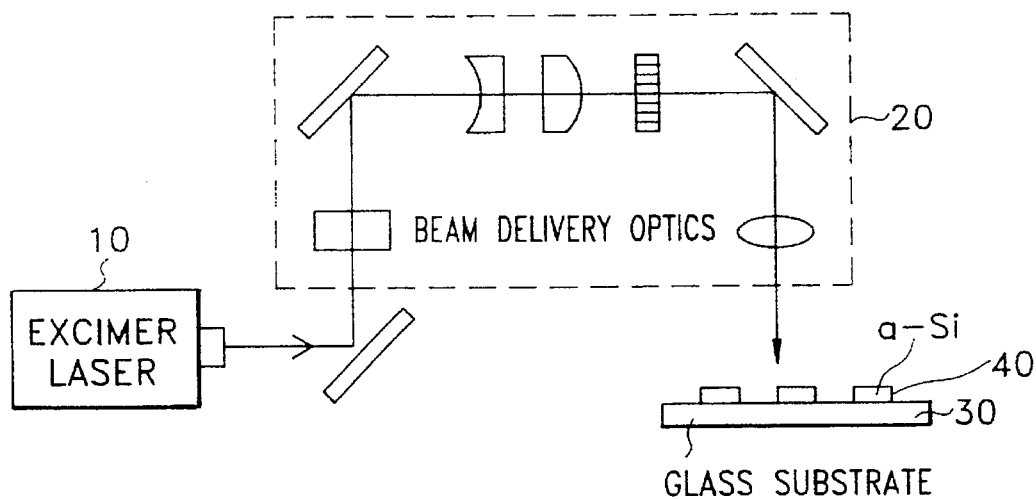
FIG. 1 is a schematic diagram showing the conventional polycrystalline silicon manufacturing device.
Figure 2:
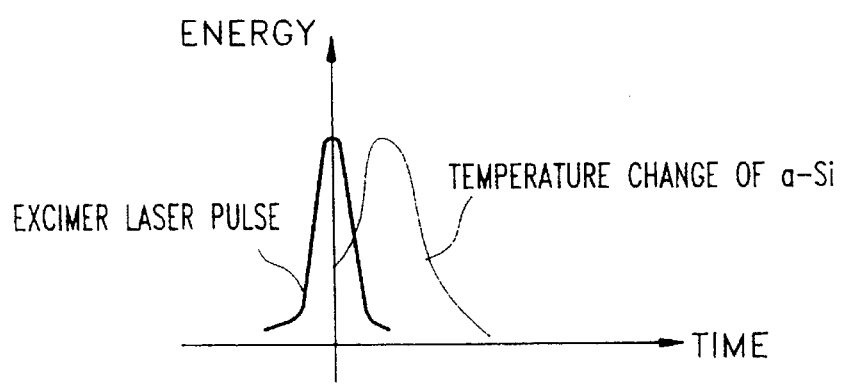
FIG. 2 is a graphical representation of the relationship between the a-Si energy and time wherein the excimer laser is irradiated.
Figure 3:
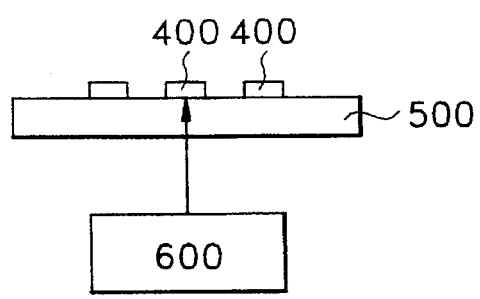
FIGS. 3 to 5 show each step of forming a polycrystalline silicon according to the manufacturing method of the present invention.

Referring to FIG. 3, in step 1, an a-Si thin film 400 formed on a substrate 500 is heated by a second light source 600 prepared in the back of substrate 500. At this time, it is desirable that the thermal energy provided by second light source 600 be kept from being accumulated on a-Si thin film 400 or on substrate 500 beyond a specific degree. Specifically, the temperature should be controlled so as to maintain the regularity below the melting point.

Figure 4:
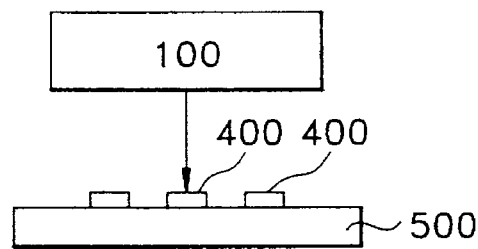

As shown in FIG. 4, in step 2, a-Si thin film 400 which is preliminarily heated by second light source 600 is heated for a predetermined time and is melted by a first light source 100 prepared in the front of substrate 500.

Figure 5:
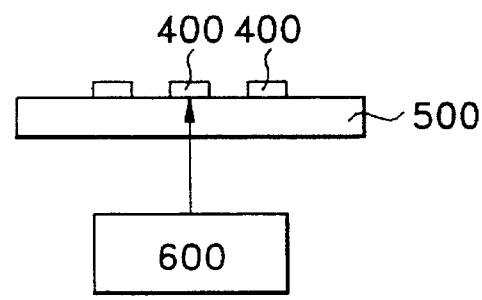

As shown in FIG. 5, in step 3, the melted a-Si is added by a properly controlled energy from second light source 600, which slows down the solidification speed of the melted a-Si. As a result, the time required for re-crystallizing Si is longer than the time required for the natural solidification.

Thus, a desired p-Si thin film can be formed on the substrate. An excimer laser having the threshold energy density of silicon can be desirably used for first light source 100, and an argon laser, yttrium-aluminum-garnet (YAG) laser, ruby laser or a helium-neon (He-Ne) laser can be used as second light source 600.

Figure 6:
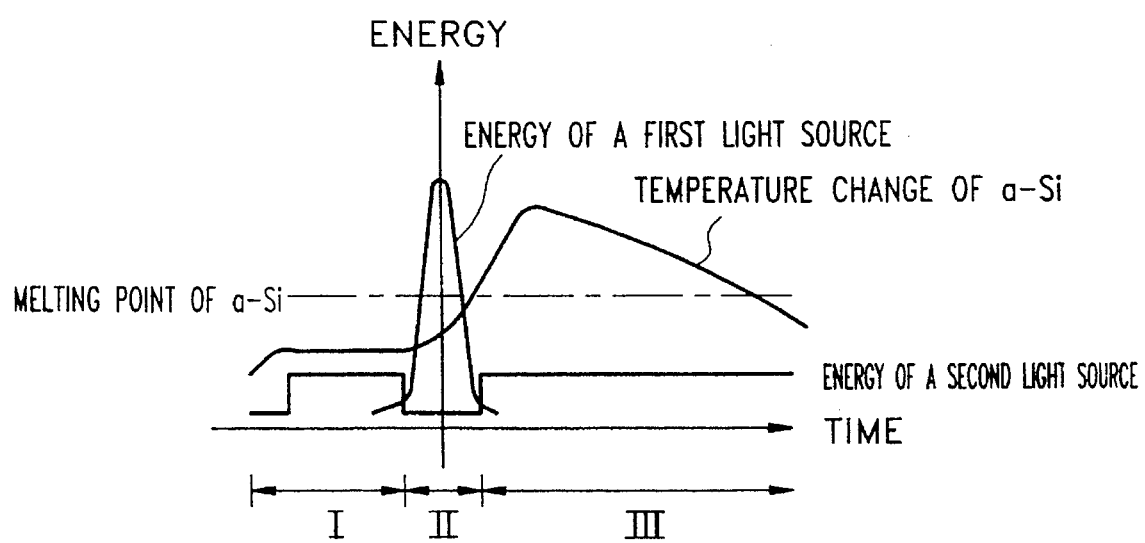
FIGS. 6 to 8 are graphical representations of the relationship between the a-Si energy and time wherein the excimer laser is scanned according to the manufacturing method of the present invention.
Figure 7:
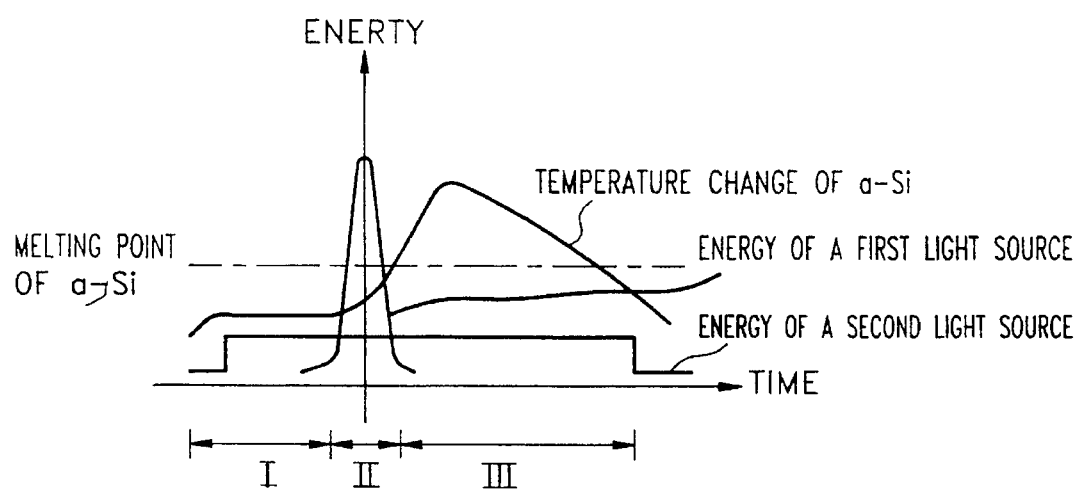
Figure 8:
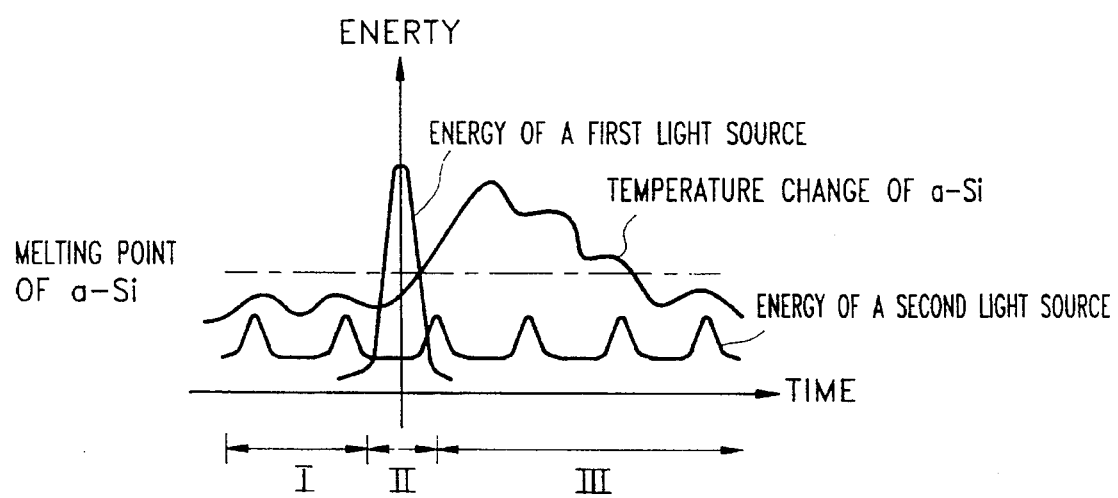

FIGS. 6 to 8 are graphical representations showing the relationship between the a-Si energy and time which show the amount of energy supplied to a-Si thin film through the first and second light sources.

FIG. 6 shows the most basic energy supply method wherein the energy is supplied in the order of the second, first and second light sources to a-Si thin film. According to this method, a-Si film is preliminarily heated by the second light source and the internal energy of a-Si film increases. As a result, the temperature stays at approximately 450° C. and the hydrogen contained in the a-Si is removed. When the predetermined time (I) passed from the preliminary heating, and an energy is supplied for a short time (II) from the first light source, a-Si is melted for approximately 100 ns, and the re-crystallization (III) starts immediately. However, the re-crystallization proceeds slowly since an energy is supplied again from the second light source during the re-crystallization. Thus, the desired uniformly and large polycrystalline silicon can be made by slowing down the speed of re-crystallization.

FIG. 7 shows that the energy is provided sequentially from the second light source following the steps of preliminary heating (I), melting (II) and re-crystallization (III), and the energy from the first light source is provided for a short time in the melting step (II) while the second light source supplies the energy.

FIG. 8 shows that the energy is provided from the second light source in a certain cycle or in pulse shape, differently from the above method, and the energy from the first light source is provided when the energy from the second light source is not at its peak value. It is desirable to provide an energy from the second light source when the energy from the first light source drops to a certain level while decreasing so that the accumulated heat of the melting a-Si thin film is not suddenly decreased when the first light source stops providing the energy.

According to the manufacturing method of the present invention, a-Si is preliminarily heated through a preliminary heating step, to thereby raise and maintain the internal energy of a-Si to a certain level and remove the hydrogen contained in the thin film. The energy from the second light source is continuously provided to a-Si thin film even after a-Si thin film is melted by the first light source, which slows down the solidification of the melted a-Si. As a result, the re-crystallization speed can be slowed effectively.

Figure 9:
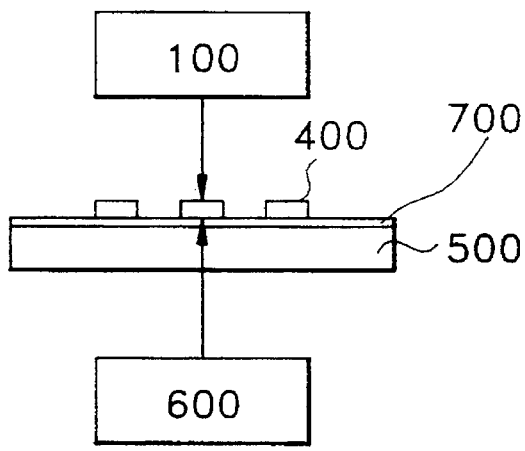
FIG. 9 is a schematic diagram showing a method for light irradiating to the substrate according to the present invention.

In embodying the present invention, p-Si having the best characteristics can be formed by preparing an adiabatic layer 700 between substrate 500 and a-Si film 400 as shown in FIG. 9. The transparent dielectric such as $SiO_2$ or $SiN_4$ whose thickness is 0.1 to 1 μm can be used for adiabatic layer 700. Adiabatic layer 700 can transmit the light from the second light source, but the heat generated from a-Si film cannot be delivered to substrate 500.

Referring to FIG. 9, a-Si thin film 400 is thermally insulated from second light source 600 by substrate 500 and adiabatic layer 700 positioned therebetween. Adiabatic layer 700 not only prevents the heat generated from a-Si thin film 400 from tranferring substrate 500 but also protects substrate 500 from high temperature. As mentioned above, since adiabatic layer 700 has an optical transmittivity, the optical energy emitted from the back of substrate 500 sequentially transmits substrate 500 and adiabatic layer 700, and then reaches a-Si thin film 400, to thereby heat a-Si thin film 400. The optical energy which reaches the a-Si thin film is converted into thermal energy and heats a-Si thin film 400. The thus-generated heat is difficult to transfer to substrate 500 due to adiabatic layer 700. Moreover, even though the heat having a high temperature is generated onto a-Si thin film by the first light source after the preliminary heating, it is difficult to transfer this generated heat to substrate 500 due to adiabatic layer 700, which means that the heat loss can be reduced by as much as the amount of the generated heat. Accordingly, most of the thermal energy converted from the optical energy is accumulated in a-Si thin film, to thereby enable an easy and rapid melting, and lowering the solidification speed in re-crystallization.

Figure 10:
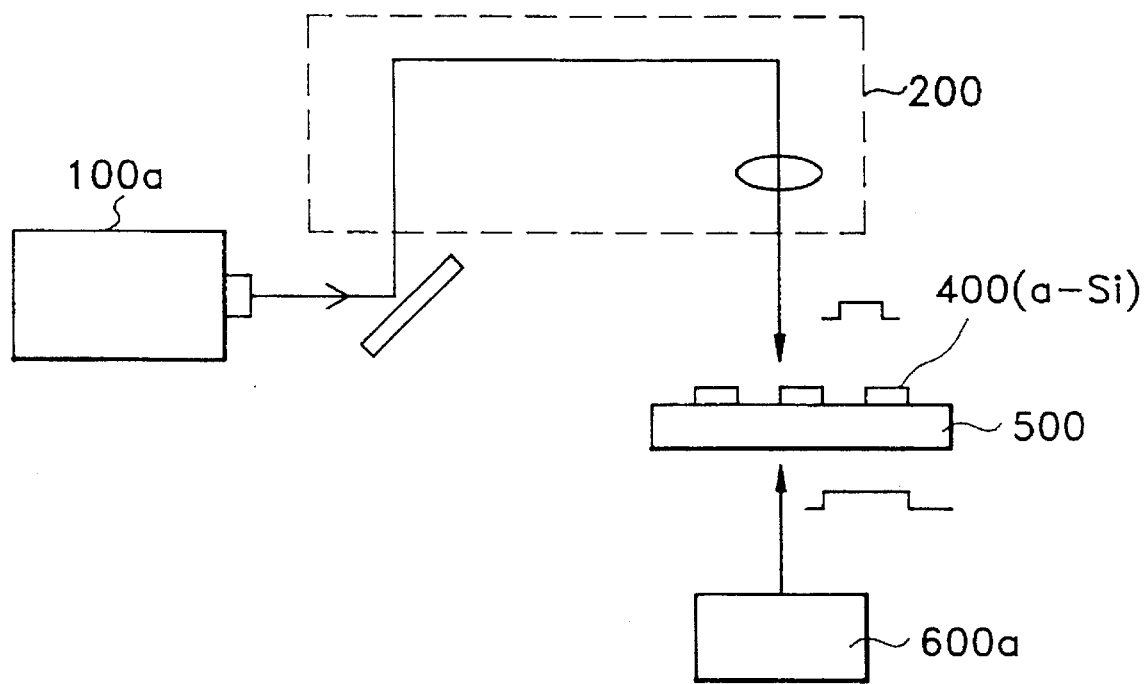
FIG. 10 is a schematic diagram of an embodiment of the manufacturing device for a polycrystalline silicon according to the present invention.

FIG. 10 shows a p-Si manufacturing device which is suitable for manufacturing p-Si of the present invention.

A device for manufacturing a polycrystalline silicon comprises an excimer laser device 100a, i.e., a first light source, a beam delivery optics 200 which delivers an excimer laser beam to a-Si thin film 400 formed on substrate 500, having spatially uniformed the energy distribution, an aid heating light source device 600a, i.e., a second light source which heats a-Si thin film. An argon laser, yttrium-aluminum-garnet (YAG) laser, ruby laser or helium-neon laser can be used as aid heating light source device 600a.

Figure 11:
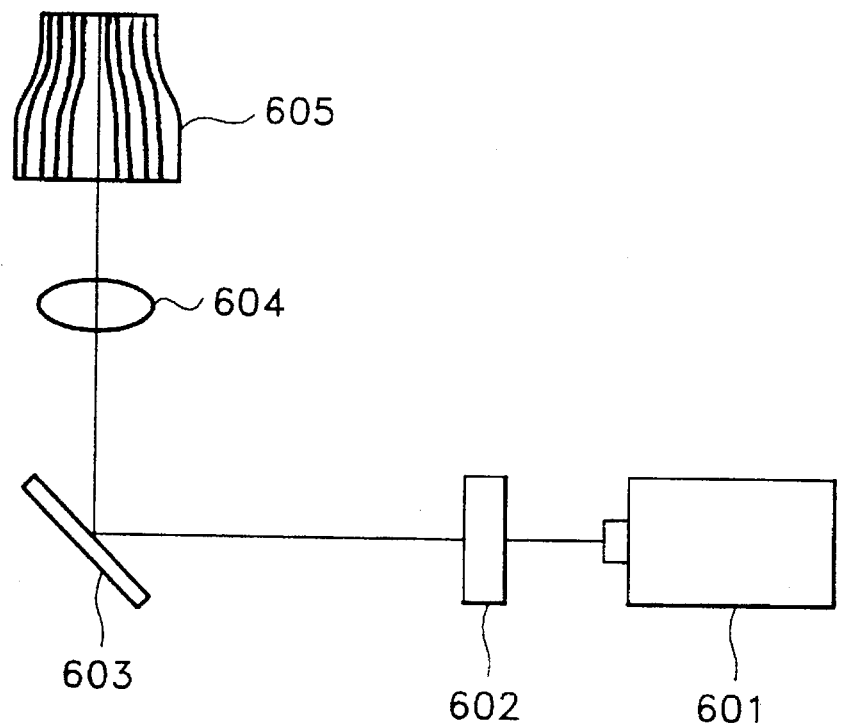
FIG. 11 is a schematic diagram of a second light source of the manufacturing device for a polycrystalline silicon according to the present invention.

Excimer laser light device 100a instantaneously generates laser whose energy is comparatively higher than that of aid heating light source device 600a. More specifically, the laser beam generated from excimer laser device 100a has high energy which can heat a-Si beyond the melting point. While the laser beam generated from aid heating light source device 600 has a relatively low energy which can heat a-Si to below the melting point. The two devices 100a and 600a are disposed so as to irradiate the laser light from the front only or front and back of substrate 500 wherein a-Si thin film is formed. The aid heating light source device 600a comprises a reflecting mirror 603 which reflects the laser light generated from a laser light source 601 and delivery optics 604 which delivers the laser light reflected from reflecting mirror 603 to substrate 500, as shown in FIG. 11.

Figure 12:
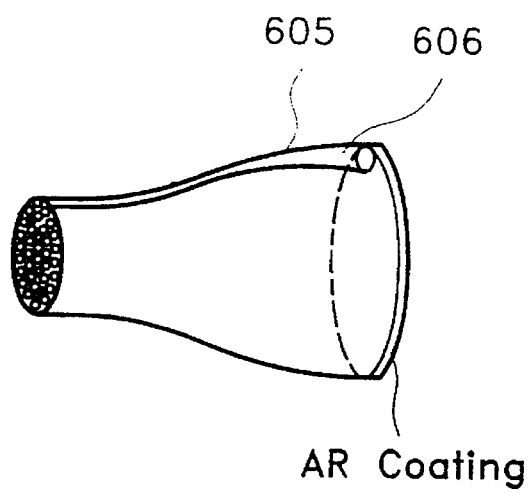
FIG. 12 shows an optical delivery medium of the second light source shown in FIG. 11.

In addition to the above structure, a shutter 602 which modulates the laser beam as a second heater into a periodical pulse waveform is provided on the beam processing path of the aid heating light source device. A mechanical shutter can be used as shutter 602, but a polarizing device of the laser light using an ultrasonic wave, i.e., the general acousto optic deflector, a polygon mirror which uses a polygonal rotating mirror or a chopper is more desirable since the shutter has to be operated in high speed so as to be linked to the excimer laser device. Meanwhile, an optical delivery medium 605 shown in FIG. 12 can be used as the above delivery optics. Optical delivery medium 605 purposes to get the focused beam whose energy density is spatially increased, and is funnel or bell-shaped bundle of fiber formed a number of quartz optical fibers 606. The diameter of the optical exit side of optical delivery medium 605 is made similar to the unit size of a-Si thin film transistor, thereby suppressing an optical loss. Since the diameter of the optical entrance should evenly receive as much light as possible, it is desirable to make the diameter of the optical entrance of each fiber (which corresponds to each a-Si thin film unit) be tens or hundreds times larger than that of the exit side. Thus, the optical delivery medium is shaped into a funnel or bell as described above. Also, an anti-reflection coating layer is prepared in the optical entrance and exit sides of the optical delivery medium so as to prevent an optical loss.

For installing the above optical delivery medium, the space between the exit side of optical delivery medium 605 and substrate 500 is limited to 1 mm and below in order to prevent the spread of the exiting light.

A manufacturing method and device of the present invention is based on the general fact that the even and large grained crystal can be formed when the crystallization speed is low in re-crystallizing a-Si. Therefore, a-Si is heated before and after the first light source or excimer laser is irradiated by the aid thermal source or by the second light source, thereby decreasing the threshold energy density when the excimer laser is irradiated and slowing down the solidification after a-Si is melted. As a result, the desired good quality p-Si thin film can be obtained.

According to the present invention, p-Si thin film can be made by a low temperature process not by the conventional high temperature process, which enables using a general soda glass substrate instead of the high-priced single crystal or quartz substrate. Also, the productivity is high since no additional heating device or time for heating the substrate is needed. Further, a dehydrogenation occurs in the course of preliminary heating process, which removes the need for additional processing. Moreover, since thus-obtained p-Si has an evenly form and large crystal grain, the semiconductor device or LCD whose reliability is excellent can be obtained, and more specifically, an element which has a large area and high integration can be obtained.

What is claimed is:

1. A method for manufacturing a polycrystalline silicon including recrystallizing an a-Si thin film formed on a substrate, wherein said manufacturing method comprises the steps of:

preliminarily heating a thin film a-Si prepared on a top side of the substrate using a second laser light source which is positioned below the substrate facing towards a bottom side of the substrate opposite to said top side of the substrate;

heating and melting said preliminarily heated a-Si using a first laser light source which is positioned opposite said second laser light source above said top side of the substrate; and re-crystallizing said melted a-Si while heating the melted a-Si using said second laser light source.

2. A method for manufacturing a polycrystalline silicon according to claim 1, wherein all excimer laser is used as said first laser light source.

3. A method for manufacturing a polycrystalline silicon according to claim 2, wherein said second laser light source is an argon laser, an yttrium-aluminum-garnet laser, a ruby laser, or a helium-neon laser.

4. A method for manufacturing a polycrystalline silicon according to claim 1, wherein said second laser light source is an argon laser, an yttrium-aluminum-garnet laser, a ruby laser, or a helium-neon laser.

5. A method for manufacturing a polycrystalline silicon according to claim 1, wherein the energy from said second laser light source is provided through the steps of said preliminary heating, melting, and re-crystallization.

6. A method for manufacturing a polycrystalline silicon according to claim 5, wherein said second laser light source provides said energy continuously or in a discontinuous pulse.

7. A method for manufacturing a polycrystalline silicon according to claim 2, wherein the energy is provided from said second laser light source through the steps of said preliminary heating, melting, and re-crystallization.

8. A method for manufacturing a polycrystalline silicon according to claim 7, wherein said second laser light source provides said energy continuously or in a discontinuous pulse.

9. A method for manufacturing a polycrystalline silicon according to claim 3, wherein the energy is provided from said second laser light source through the steps of said preliminary heating, melting, and re-crystallization.

10. A method for manufacturing a polycrystalline silicon according to claim 9, wherein said second laser light source provides said energy continuously or in a discontinuous pulse.

11. A method for manufacturing a polycrystalline silicon comprising the steps of:

forming an adiabatic layer on a first side of the substrate;

forming a-Si thin film on said adiabatic layer;

preliminarily heating said a-Si using a second laser light source positioned on a second side of said substrate opposite said first side;

heating and melting the preliminarily heated a-Si using a first laser light source positioned on said first side of said substrate; and re-crystallizing the melted a-Si while heating the melted a-Si using said second laser light source.

12. A method for manufacturing a polycrystalline silicon according to claim 11, wherein said adiabatic layer is manufactured using either $SiO_2$ or $Si_3N_4$.

13. A method for manufacturing a polycrystalline silicon according to claim 11, wherein an excimer laser is used as said first laser light source.

14. A method for manufacturing a polycrystalline silicon according to claim 13, wherein said second laser light source is an argon laser, an yttrium-aluminum-garnet laser, a ruby laser, or a helium-neon laser.

15. A method for manufacturing a polycrystalline silicon according to claim 11, wherein said second laser light source is an argon laser, an yttrium-aluminum-garnet laser, a ruby laser, or a helium-neon laser.

16. A method for manufacturing a polycrystalline silicon according to claim 14, wherein the energy from said second laser light source is provided through the steps of said preliminary heating, melting, and re-crystallization.

17. A method for manufacturing a polycrystalline silicon according to claim 16, wherein said second laser light source provides said energy continuously or in a discontinuous pulse.

* * * * *